(12) United States Patent
Rabbani et al.

(10) Patent No.: US 6,853,318 B1
(45) Date of Patent: Feb. 8, 2005

(54) DIGITAL IMAGE COMPRESSION UTILIZING SHRINKAGE OF SUBBAND COEFFICIENTS

(75) Inventors: Majid Rabbani, Pittsford, NY (US); Aaron T. Deever, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/748,609

(22) Filed: Dec. 30, 2003

(51) Int. Cl.[7] .............................................. H03M 7/00
(52) U.S. Cl. ....................... 341/50; 341/51; 375/240.1
(58) Field of Search .................... 341/50, 51; 382/209, 382/166; 375/240.1; 714/746

(56) References Cited

U.S. PATENT DOCUMENTS

| | | | | |
|---|---|---|---|---|
| 5,497,435 A | * | 3/1996 | Berger | 382/249 |
| 5,600,373 A | * | 2/1997 | Chui et al. | 375/240.1 |
| 5,901,246 A | * | 5/1999 | Hoffberg et al. | 382/209 |
| 6,125,201 A | * | 9/2000 | Zador | 382/166 |
| 6,252,994 B1 | | 6/2001 | Nafarich | |
| 6,470,469 B1 | * | 10/2002 | Chou et al. | 714/746 |
| 6,668,090 B1 | | 12/2003 | Joshi et al. | |

OTHER PUBLICATIONS

US2003/0044078 A1, Publication Date: Mar. 6, 2003, US patent application No. 09/898,230, filed Jul. 3, 2001, A Method for Utilizing Subject Content Analysis for Producing a Compressed Bit Stream From a Digital Image, Joshi et al.

IEEE Transaction on Image Processing, David Taubman, vol. 9, No. 7, pp. 1158–1170, (Jul. 2000), High Performance Scalable Image Compression With EBCOT.

* cited by examiner

Primary Examiner—Jean Bruner Jeanglaude
(74) Attorney, Agent, or Firm—Robert Luke Walker

(57) ABSTRACT

In compressions of digital images having a plurality of initial pixels, an image type and a quantization step-size set preassigned to the image type, are associated with a respective coordinate of each of the initial pixels. The digital image is decomposed to produce a plurality of subbands. Coefficients of the subbands define a plurality of resultant pixels, each having a respective one of the coordinates. The subband coefficients also define, for each subband coefficient, a group of resultant pixels to which the subband coefficient contributes. After the decomposition, each of the subband coefficients are shrunk by a respective adjustment that is a function of the respective quantization step-size sets associated with the coordinates of the resultant pixels to which the subband coefficient contributes.

20 Claims, 16 Drawing Sheets

|  | IMAGE TYPE | | | | |
|---|---|---|---|---|---|
|  | $I_1$ | $I_2$ | $I_3$ | ... | $I_N$ |
| SUBBAND 1 | $d_{1,1}$ | $d_{1,2}$ | $d_{1,3}$ |  | $d_{1,N}$ |
| 2 | $d_{2,1}$ | $d_{2,2}$ | $d_{2,3}$ |  | $d_{2,N}$ |
| 3 | $d_{3,1}$ | $d_{3,2}$ | $d_{3,3}$ |  | $d_{3,N}$ |
| ⋮ |  |  |  |  |  |
| m | $d_{m,1}$ | $d_{m,2}$ | $d_{m,3}$ |  | $d_{m,N}$ |

FIG. 6

DIGITAL IMAGE COMPRESSION UTILIZING SHRINKAGE OF SUBBAND COEFFICIENTS

CROSS REFERENCE TO RELATED APPLICATIONS

Reference is made to commonly assigned, co-pending U.S. patent application Ser. No. 10/748,935, entitled: IMAGE COMPRESSION UTILIZING DISCARDING OF BITPLANES, filed Dec. 30, 2003, in the names of Aaron T. Deever, which is hereby incorporated herein by reference.

FIELD OF THE INVENTION

The invention relates to the field of image compression and the JPEG2000 standard and more particularly relates to digital image compression utilizing shrinkage of subband coefficients.

BACKGROUND OF THE INVENTION

Part I of JPEG2000 was issued as an international standard for image coding in December 2000. (The standard is ISO 15444|ITU-T Recommendation T.800.) Based on the discrete wavelet transform, JPEG2000 provides several advantages over the previous discrete cosine transform (DCT)-based JPEG standard, including improved compression efficiency, joint lossy to lossless compression in a single bitstream, and region of interest coding. The fundamental building blocks of a typical JPEG2000 encoder are shown in FIG. 1.

The first encoder stage 102 provides pre-processing of the original image data 101. This can include partitioning of the data into tiles, each of which is compressed independently using its own set of specified compression parameters. The tiled data can also be subjected to an intercomponent transform to decorrelate color data.

At the next stage 104, each tile-component 103 undergoes a wavelet decomposition, converting the spatial domain image data into frequency domain subband coefficients 105. A 3-level, 2-dimensional wavelet decomposition is depicted in FIG. 2. The first stage of the wavelet decomposition converts the image data into four subbands of coefficients. Each subband is denoted by two letters ('H' and 'L') indicating whether the coefficients correspond to high- or low-pass filtering in the horizontal and vertical directions, respectively in that order, as well as a number indicating the decomposition level. The decomposition is applied recursively to the LL subband, resulting in a total of 10 subbands for a 3-level transform.

The subband coefficients 105 are then quantized using a uniform deadzone quantizer 106. For each subband j, a basic quantizer step-size $\Delta_j$ is selected by the user to quantize all the samples in that subband. For a given coefficient c in subband j, the quantization formula is given by $$q(c) = sgn(c) \left\lfloor \frac{|c|}{\Delta_j} \right\rfloor,$$

where q(c) represents the quantizer index associated with coefficient c. This corresponds to a quantizer with step-size $\Delta_j$ and a deadzone of size $2\Delta_j$, as depicted in FIG. 3.

At the decoder, the reconstructed value, ĉ, associated with c, is obtained by the following formula:

$$\hat{c} = \begin{cases} (q(c) + \alpha)\Delta_j & \text{if } q(c) > 0 \\ (q(c) - \alpha)\Delta_j & \text{if } q(c) < 0, \\ 0 & \text{otherwise} \end{cases}$$

where $0 \le \alpha < 1$, and typically $$\alpha = \frac{1}{2},$$

corresponding to midpoint reconstruction. With midpoint reconstruction and a step-size of $\Delta_j$, any coefficient with a quantizer index of 0 has an error less than $\Delta_j$, while any coefficient with quantizer index not equal to 0 has an error no greater than $$\frac{\Delta_j}{2}.$$

One of the features of quantization with a deadzone equal to twice the step-size is its optimal embedded structure. This means that if an $M_j$-bit quantizer index (associated with coefficient c in subband j with quantizer step-size $\Delta_j$) is transmitted progressively starting with the most significant bit (MSB) and proceeding to the least significant bit (LSB), the resulting index after decoding only $N_j$ bits is identical to that obtained by using a similar quantizer with a step-size of $\Delta_j 2^{M_j - N_j}$. Thus the effective quantization step-size associated with a coefficient c in subband j is not restricted to the value $\Delta_j$, but can be altered at the decoder based on how many of the quantizer index bits are finally decoded. Similarly, the effective quantizer step-size can be altered at the encoder by adjusting how many of the quantizer index bits are included in the final compressed bitstream.

Quantizer step-sizes are often chosen so as to minimize perceived error in the reconstructed image, based on properties of the human visual system. In the case of visually lossless compression, the quantization step-sizes can be interpreted as the maximum error allowed in the subbands without incurring any visual artifacts.

Referring again to FIG. 1, in the JPEG2000 encoder, quantized subband coefficients 107 are partitioned into small rectangular blocks referred to as codeblocks. Each codeblock is encoded independently using an adaptive binary arithmetic coder 108. Codeblocks are encoded bitplane by bitplane, starting with the most significant bitplane. The encoding of a codeblock bitplane is further subdivided into three coding passes, each one containing information for only a subset of the coefficients of the codeblock. The product of each coding pass can be referred to as a fractional bitplane or partial-bitplane. The generation of compressed coding pass data is referred to in JPEG2000 as Tier 1 coding.

Finally, the compressed coding pass data 109 is organized by a bitstream organization module 110 into the output compressed bitstream 111. The arrangement of the compressed coding pass data into the final bitstream is referred to in JPEG2000 as Tier 2 coding.

The human visual system has varying sensitivity to signals of different spatial frequency, orientation and color. The properties of the human visual system can be modeled to derive an appropriate quantization step-size for every wavelet subband. The optimal quantization step-size for a particular wavelet coefficient, however, is also a function of image content. Many studies have shown that regions of an image containing sharp edges are much less perceptually forgiving of quantization error than smooth or detailed regions. Thus wavelet coefficients corresponding to sharp edges require fine quantization, while coarser quantization is acceptable for coefficients associated with smooth or detailed regions.

Given an image with regions of text, line art, background and photographic content, it is desirable to be able to quantize these regions differently. Fine quantization should be used in regions of text and line art to retain sharp edges, while coarser quantization is visually acceptable in background and photographic regions.

Alternatively, if a single quantization scheme must be applied uniformly throughout the entire image, one of two trade-offs occurs. If the finer quantization step-sizes associated with text are used to encode the entire image, regions of photographic content are represented with higher fidelity and bit-rate than is visually necessary, at the expense of an increased overall compressed file size. If the coarser quantization step-sizes associated with photographic content are used to encode the entire image, regions of text are not encoded with sufficient fidelity and suffer visual artifacts. Typically, these textual visual artifacts are considered unacceptable, and thus the quantization step-sizes are designed to ensure textual fidelity, at the expense of overcoding of the photographic regions.

Adaptive quantization within the original DCT-based JPEG standard is disclosed in U.S. Pat. No. 6,252,994, to Nafarieh, entitled "Adaptive Quantization Compatible with the JPEG Baseline Sequential Mode".

Many fundamental differences exist between adaptive quantization for JPEG and JPEG2000. Baseline JPEG utilizes discrete cosine transform blocks, quantization without an extended deadzone, and encoding in a non-progressive manner. JPEG2000 utilizes wavelet coefficients, quantization with an extended deadzone, and bitplane encoding. These different characteristics require different adaptive quantization techniques with JPEG2000.

JPEG2000 offers flexibility toward achieving adaptive quantization. One method is by initially dividing the image spatially into tiles. Each tile is wavelet transformed and quantized independently, and thus each tile can be classified and quantized accordingly. The main drawback of this solution is the granularity of the classification. Tiles are typically 1024×1024 or 512×512, with smaller tiles resulting in an overall performance decrease. Any tile containing any text or line art information must be quantized finely, and with large tiles it becomes difficult to identify tiles completely free of text and line art information that can be quantized more aggressively.

Ideally, each wavelet coefficient is treated individually, and effectively quantized according to its individual type classification. Unfortunately, current JPEG2000 encoder algorithms have no mechanism by which to reach this result. A partial solution is a rate-distortion approach.

The nominal rate-distortion approach to JPEG2000 encoding is described in "High performance scalable compression with EBCOT," *IEEE Transactions on Image Processing,* David Taubman, 9(7), pp. 1158–1170, (July 2000). In this method, each coding pass is assigned a rate value according to the size of the compressed data comprising the coding pass, and a distortion value according to the reduction in distortion achieved by including the coding pass data in the final bitstream. Mean squared error (MSE) or weighted MSE is used as the distortion metric. A rate-distortion optimization algorithm chooses those coding passes that yield the greatest rate-distortion performance (greatest reduction in distortion per bit of compressed data) to include in the final bitstream, given an overall rate constraint. While this approach yields optimal rate-distortion performance, it can not ensure any specific effective quantization step-size for any codeblock. If no rate constraint is specified, all codeblock data is included in the final bitstream. In this case, the effective quantizer step-size of a codeblock is that specified by the user for the corresponding subband, and there is no adaptivity from one codeblock to another within a subband. This algorithm is also restricted to decisions at the codeblock level, and does not evaluate coefficients individually.

In U.S. Pat. No. 6,668,090, entitled "Producing a Compressed Digital Image Organized into Layers Corresponding to Increasing Visual Quality Levels and Providing Rate-control of such Compressed Digital Image," filed by Joshi and Jones, a visually weighted MSE term is calculated for each coding pass. This technique allows the bitstream to be optimized from a visual perspective, but provides no mechanism by which to ensure adaptive quantization.

In U.S. patent application Ser. No. 09/898,230, entitled "A Method for Utilizing Subject Content Analysis for Rate-control in a Lossy Image Compression System," filed by Luo and Joshi, the distortion reduction calculation is modified to also be a function of the probability that image pixels correspond to the main subject. This technique can be used to weight the rate-distortion values of coding passes corresponding to certain regions of an image, but again cannot ensure that a specific effective quantization step-size will be achieved for any particular codeblock or coefficient.

JPEG2000 Part I also allows region of interest (ROI) coding, by which text regions can be identified and the corresponding encoded data placed first in the final bitstream. This method can be used to ensure that a specific collection of coefficients corresponding to the ROI are included at the desired quantization step-size in the final bitstream. However, there is no mechanism to ensure that the remaining coefficients are subsequently included at the desired effective quantization step-size.

It would thus be desirable to provide encoding methods, computer program products, and image encoders, which allow adaptive quantization of the wavelet coefficients at the coefficient level based on a classification of portions of an image into different image types and optionally allow JPEG2000 Part I compliance.

SUMMARY OF THE INVENTION

The invention is defined by the claims. The invention, in broader aspects, provides compressions of digital images having a plurality of initial pixels, an image type and a quantization step-size set preassigned to the image type, are associated with a respective coordinate of each of the initial pixels. The digital image is decomposed to produce a plurality of subbands. Coefficients of the subbands define a plurality of resultant pixels, each having a respective one of the coordinates. The subband coefficients also define, for each subband coefficient, a group of resultant pixels to which the subband coefficient contributes. After the decomposition, each of the subband coefficients are shrunk by a respective adjustment that is a function of the respective quantization step-size sets associated with the coordinates of the resultant pixels to which the subband coefficient contributes.

It is an advantageous effect of the invention that improved encoding methods, computer program products, and image encoders are provided, which allow shrinkage of wavelet coefficients and optional discarding of unnecessary bitplanes of data based on a classification of portions of an image into different image types and optionally allow JPEG2000 Part I compliance.

BRIEF DESCRIPTION OF THE DRAWINGS

The above-mentioned and other features and objects of this invention and the manner of attaining them will become more apparent and the invention itself will be better understood by reference to the following description of an embodiment of the invention taken in conjunction with the accompanying figures wherein:

FIG. 6 is a diagram of the image type bitplane discard table of FIG. 4.

DETAILED DESCRIPTION OF THE INVENTION

Figure 1:
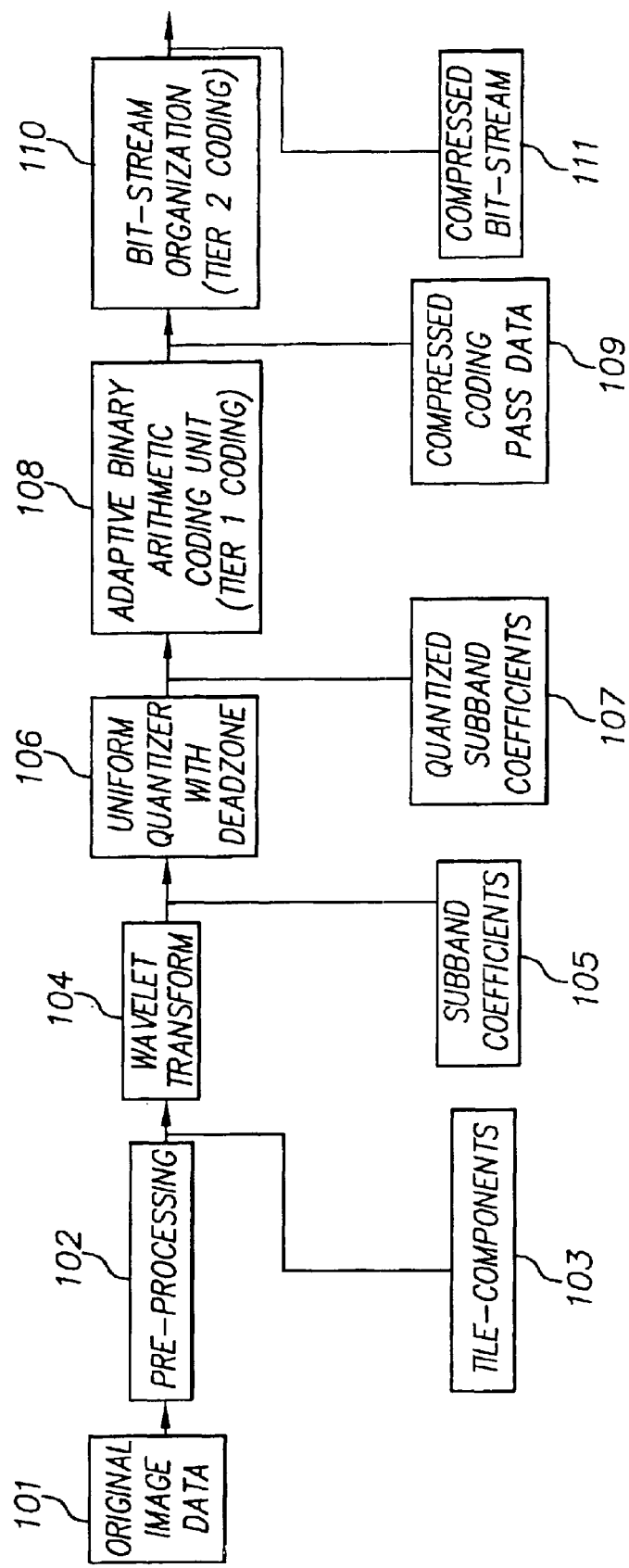
FIG. 1 is a diagrammatical view of a prior art JPEG2000 compliant image encoder.

The invention relates to digital image compression. The invention is generally described herein in relation to embodiments compliant with the JPEG2000 image compression standard, but is not limited to such embodiments, or that standard. The present description details particular features forming part of, or cooperating with, a particular algorithm in accordance with the present invention. Attributes not specifically shown or described herein can be selected from those described above in relation to JPEG2000, in "Information Technology—JPEG2000 Image Coding System, ISO/IEC International Standard 15444-1, ITU Recommendation T.800", or otherwise known in the art. In the following description, a particular embodiment of the present invention would ordinarily be implemented using a software program, although those skilled in the art will readily recognize that the equivalent of such software can also be constructed in hardware or a combination of software and hardware. Given the disclosure herein, such implementations are within the ordinary skill of those of skill in the art.

The term "digital image data" and like terms refer to a digital image, or a component of a digital image or one or more tiles of a digital image. For convenience, the invention is generally discussed herein in relation to an embodiment in which an entire digital image is treated as a single tile.

Some portions of the following are presented in terms of algorithms and symbolic representations of operations on data bits within a computer memory. These algorithmic descriptions and representations are used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. For convenience, these signals are sometimes referred to herein in relation to the underlying information using referents such as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "forming" or the like, refer to the action and processes of a computer system, or similar data processing device, that manipulates and transforms data represented as physical (e.g. electronic) quantities within the computer system's registers and memories into other data similarly represented as physical quantities within the computer system memories or registers or other such information storage, transmission or display devices.

The present invention also relates to systems including specific pieces of apparatus for performing the operations described herein. Apparatus such as a programmable computer may be specially constructed for the required purposes, or may comprise a general purpose computer selectively activated or reconfigured by a computer program stored in the computer.

The algorithms and displays presented herein are not inherently related to any particular computer or other apparatus. Various general purpose systems may be used with programs in accordance with the teachings herein, or it may prove convenient to construct more specialized apparatus to perform the methods. The structure for a variety of these systems will appear from the description below. In addition, the present invention is not described with reference to any particular programming language. It will be appreciated that a variety of programming languages may be used to implement the teachings of the invention as described herein.

References to "in a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The invention is thus inclusive of combinations of the embodiments described herein.

Elements not specifically shown or described herein may be selected from those known in the art. Certain aspects of the embodiment to be described may be provided in software. Given the method as shown and described according to the invention in the following materials, software not specifically shown, described or suggested herein that is useful for implementation of the invention is conventional and within the ordinary skill in such arts.

It will be understood that the system and computer program product of the present invention may make use of image manipulation algorithms and processes that are well known. Accordingly, the present description will be directed in particular to those algorithms and processes forming part of, or cooperating more directly with, the method of the present invention. Thus, it will be understood that the system and computer program product of the present invention may embody algorithms and processes not specifically shown or described herein that are useful for implementation. Such algorithms and processes are conventional and within the ordinary skill in such arts.

Other aspects of such algorithms and systems, and hardware and/or software for producing and otherwise processing the images involved or co-operating with the computer program product of the present invention, are not specifically shown or described herein and may be selected from such algorithms, systems, hardware, components, and elements known in the art.

The computer program for performing the method of the present invention may be stored in a computer readable storage medium. This medium may comprise, for example: magnetic storage media such as a magnetic disk (such as a hard drive or a floppy disk) or magnetic tape; optical storage media such as an optical disc, optical tape, or machine readable bar code; solid state electronic storage devices such as random access memory (RAM), or read only memory (ROM); or any other physical device or medium employed to store a computer program. The computer program for performing the method of the present invention may also be stored on computer readable storage medium that is connected to the image processor by way of a local or remote network or other communication medium. Those skilled in the art will readily recognize that the equivalent of such a computer program product may also be constructed in hardware or firmware known as application specific integrated circuits (ASICs). An ASIC may be designed on a single silicon chip to perform the method of the present invention. The ASIC can include the circuits to perform the logic, microprocessors, and memory necessary to perform the method of the present invention. Multiple ASICs may be envisioned and employed as well for the present invention.

A computer or machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

In the method, image types are assigned to each of the pixels of the digital image data. The assignments are based upon predetermined criteria for compression/decompression of different image types, such as text, line art, gray-scale drawings, photographic images, and so on. Such criteria are well known to those of skill in the art and can be directly applied here or simply derived by trial and error.

The associating step can be implemented by forming a map of the image types of the pixels and then mapping spatial influence of the coefficients onto the pixel map to define a plurality of respective influence regions. The image type for each influence region can then be selected. The selection can be based on the kinds of criteria used to determine other treatments of regions of an image. For example, the selection can be a median or mean image type. Alternatively, the image type can be selected, in each influence region, as that image type having the corresponding subband quantization step-size set of smallest magnitude. This approach helps ensure against unanticipated loss of image content.

Each image type has a preassigned quantization step-size set. The term "quantization step-size set" and like terms refer to a collection of quantization step-sizes for the subbands of a particular type of decomposition (generally here a discrete wavelet decomposition). Relative magnitudes of quantization step-size sets compare step-sizes for like subbands. A particular quantization step-size set is sometimes referred to herein as being associated with or applied to a particular subband coefficient. It will be understood that during quantization only one of the members of a quantization step-size set is used with the particular subband coefficient.

The digital image data is decomposed by a subband decomposition to produce a plurality of subbands. The term "subband decomposition" refers to a transform that maps spatial domain pixels (also referred to herein as "initial pixels") to frequency domain (subband) coefficients. Examples of subband decompositions include the discrete octave-based wavelet transform and the uniform discrete wavelet transform. Each subband has a plurality of subband coefficients. (References herein to "coefficients", unless otherwise identified, refer to subband coefficients produced by a decomposition step. Each subband decomposition has an associated inverse transform that maps frequency domain (subband) coefficients to spatial domain pixels (also referred to herein as "resultant pixels").

Coordinates of the set of initial pixels and the set of resultant pixels are predefined and remain the same. The term "coordinate" and like terms are used here to refer to a set of numbers or the like that identify a location on a map of the pixels. For two-dimensional images, a coordinate has two numerical values, corresponding to relative positions on respective x and y axes. Digital image data is usually in the form of two-dimensional images, but digital image data can have two, three, or more dimensions. The initial pixels that contribute to a particular subband coefficient may or may not have the same coordinates as the resultant pixels contributed to by the respective subband coefficient.

In embodiments of some of the methods disclosed herein, prior to encoding, each of the subband coefficients are shrunk by an adjustment that is a function of a quantization step-size set or sets associated with the coordinates of the resultant pixels. The quantization step-size set or sets for particular coordinates are those associated with the image types of the initial pixels having those same coordinates.

The resulting adjusted coefficients are quantized to provide respective quantized coefficients. In particular embodiments, the quantizing of each adjusted coefficient utilizes a predetermined base quantization step-size set. This set preferably has the smallest magnitude of the plurality of quantization step-size sets associated with the image types.

Subsequent to the transforming, each subband is partitioned into a plurality of codeblocks. Following the shrinking, each codeblock is entropy encoded independently of the other codeblocks to provide encodement values. Encodement values are combined to provide a bitstream, which is then transmitted or stored or otherwise utilized as desired. The bitstream can be supplied with a header and/or other formatting as required for a particular digital file type.

In particular embodiments, the shrinking and quantizing can together provide an effective quantization step-size set for each codeblock that is larger than or equal to the minimum or base quantization step-size set of the digital image data. The term "effective quantization step-size set" refers to a net result that mimics the effect that would be provided by a quantization alone using a quantization step-size set having larger step-sizes.

In some embodiments, bitplanes are formed after decomposition and one or more of the bitplanes are discarded, before the combining step. Portions of bitplanes, referred to herein as "partial-biplanes" can be discarded instead of or in addition to complete bitplanes. A partial-bitplane is less than a complete bitplane and can be the product of an incomplete number of coding passes of an encodement procedure that requires multiple coding passes. For example, a partial-bitplane can be the product of one or two coding passes of a three pass entropy coding procedure. The term "partial-bitplane" is inclusive of the more specific term "fractional bitplane", which refers to the product of one coding pass. Discarding of partial-bitplanes is inclusive of the discarding of complete bitplanes. For convenience discarding of bitplanes is generally discussed herein in relation to discarding of complete bitplanes. It will be understood that partial-bitplanes are discarded in the same manner.

In an embodiment utilizing discarding of bitplanes, the shrinking, quantizing, and discarding steps can together provide an effective quantization step-size set for each codeblock that is larger than or equal to the minimum or base quantization step-size set of the digital image data.

Bitplanes are discarded that have a discard parameter in a predetermined range. The discard parameter is a function of a respective quantization step-size set or sets of the contributing pixels of the coefficients of the bitplane. The discard parameter can also be a function of a predetermined quantization step-size set. This predetermined set is associated with a base level image type of the tile or, alternatively, of the particular codeblock.

In a particular embodiment, bitplanes are assigned discard numbers increasing in value starting from zero for the least significant bit plane set by the quantization step-size and increasing by one for each succeeding bitplane. The discard limit is subtracted from a discard number to provide a corresponding discard parameter. The value of a particular discard limit is a function of the quantization step-size set assigned to a particular codeblock and of the minimum or base quantization step-size set. A discard range is predetermined to be negative discard parameters. For example, a discard limit for a particular codeblock is 2. A bitplane has a discard number of 0. The corresponding discard parameter is −2. The bitplane is discarded.

Adaptive Quantization with Shrinkage of Subband Coefficients

Referring now to FIGS. 4–12, in a particular embodiment, the compressed bitstream provided is compliant with Part I of the JPEG2000 standard. Each subband coefficient is classified and modified based on its classification type and the classification type of its corresponding codeblock. Each coefficient is modified by shrinking its magnitude and subsequently by discarding unnecessary bitplanes of data generated based on quantization step-sizes defined for a base image type.

Figure 2:
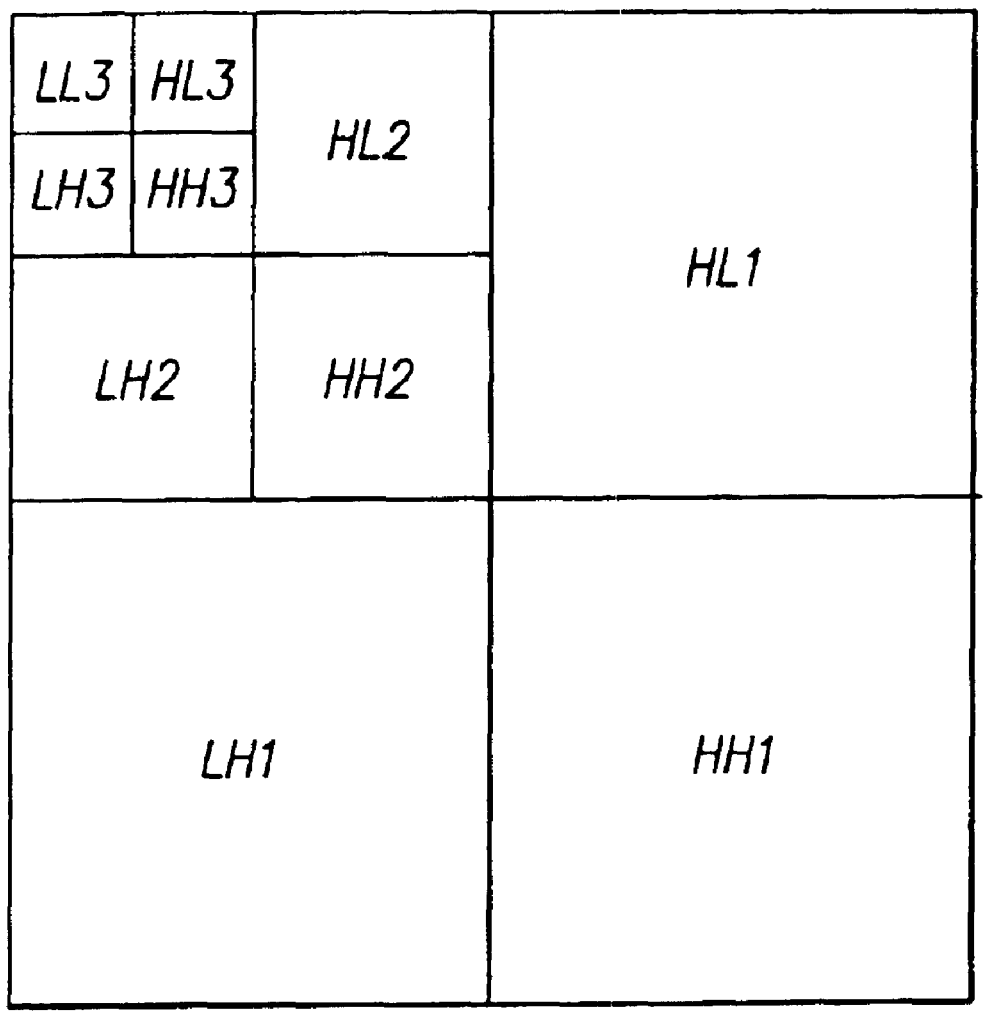
FIG. 2 is a graph of a 3-level, 2-dimensional wavelet decomposition.
Figure 3:
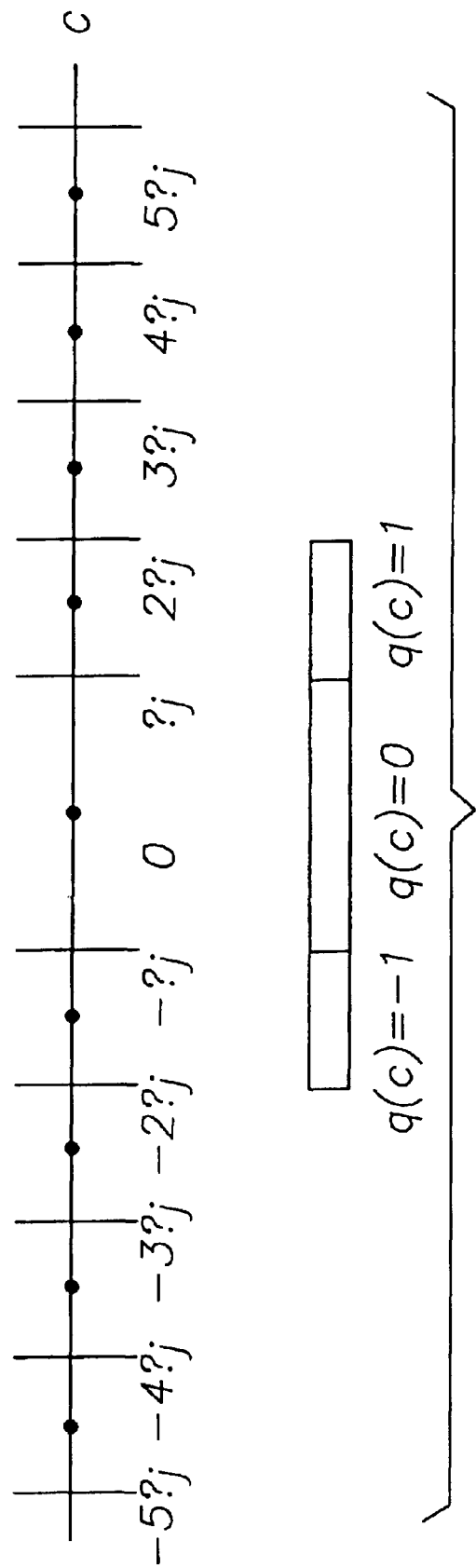
FIG. 3 is a graph of the decision thresholds (indicated by dashed lines), midpoint reconstruction levels (indicated by dots) and quantizer indices associated with a uniform scalar quantizer with step-size $\Delta_j$ and deadzone equal to $2\Delta_j$.
Figure 4:
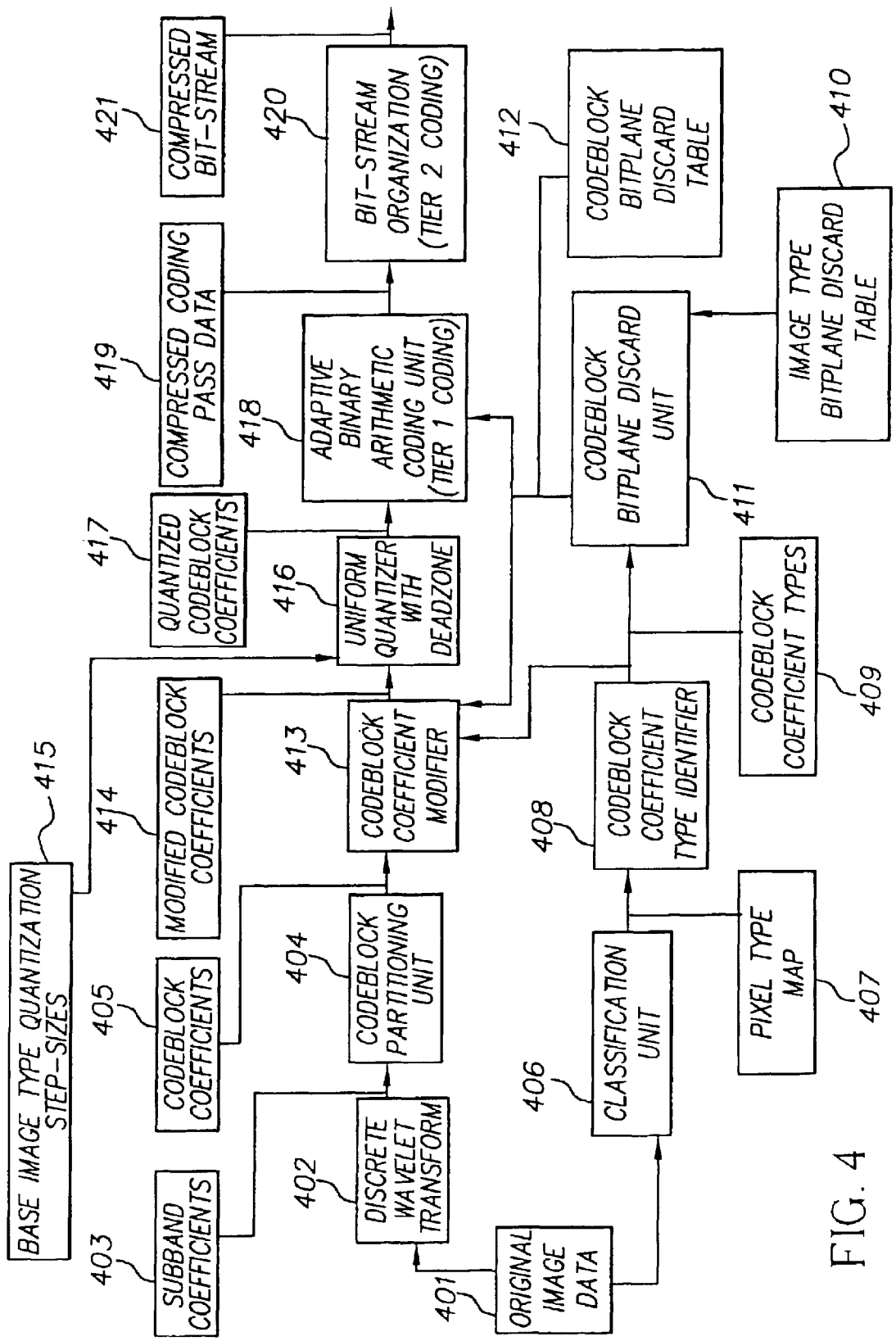
FIG. 4 is a diagrammatical view of a particular embodiment of the image encoder.

A flow chart of an image encoder according to this embodiment is shown in FIG. 4. A digital image 401 undergoes a discrete wavelet transform (DWT), such as the discrete octave-based wavelet transform shown in FIG. 2, in a DWT unit 402 to produce an image representation in terms of subband coefficients 403. If the image has multiple components (e.g., RGB), a luminance-chrominance transformation can be applied to convert it to a YCbCr representation before the subband decomposition step. It is possible to divide each component of the image into multiple tiles, but for convenience in this discussion, only a single tile consisting of the entire image is used. The subband coefficients 403 are partitioned into codeblocks 405 by a codeblock partitioning unit 404.

The original image data is also input to a classification unit 406, which determines the image type associated with each initial pixel, and outputs a first map 407. The first map is input to a subband coefficient type identifier 408, which identifies the image type associated with each coefficient, and outputs the subband coefficient types 409. The subband coefficient types, along with an image type bitplane discard table 410, are input to a codeblock bitplane discard unit 411. The image type bitplane discard table is predetermined and indicates how many bitplanes of data can be discarded from coefficients belonging to a particular image type and subband. (This and other predetermined values herein can be readily determined heuristically, particularly if image contents have a limited range of expected characteristics.) The codeblock bitplane discard unit computes a table indicating how many bitplanes of data can be discarded from each codeblock 412.

The subband coefficients, along with the subband coefficient types and the codeblock bitplane discard table, are input to the subband coefficient modifier 413. The subband coefficient modifier modifies each coefficient according to its image type and how many bitplanes of data will subsequently be discarded from its codeblock, and outputs the modified subband coefficients 414. The modified subband coefficients are quantized with a uniform quantizer with deadzone 416 according to a set of quantizer step-sizes appropriate for a base image type 415.

The quantized subband coefficients 417 and the codeblock bitplane discard table are then input to the adaptive binary arithmetic coder unit 418. An adaptive binary arithmetic coder encodes the coefficients for each codeblock, discarding appropriate bitplanes according to the codeblock bitplane discard table, and producing compressed coding pass data 419. The compressed coding pass data is aggregated by a bitstream organization unit 420 into the final compressed bitstream 421.

FIG. 4 will now be described in greater detail. Central to the encoding process is the concept of different image types, e.g. text and background, and different desired quantization levels associated with each image type. For a single component image, the discrete wavelet transform produces subband coefficients for m subbands, where m=3k+1, and k is the number of decomposition levels in the wavelet transform. Any image type I has associated quantization step-sizes $\Delta_j^I$ for j=1,2,3, . . . , m that indicate the desired quantization level for coefficients from each subband identified as having that image type.

In addition to the quantization step-sizes defined for each image type, a set of base image type quantization step-sizes, $\Delta_j^B$, are defined. For each subband j, the base type quantizer step-size $\Delta_j^B$ is chosen to correspond to the finest quantization, and correspondingly the most precise representation, required across all image types to represent the coefficients of subband j at the desired fidelity. In a particular embodiment, for each subband, j, the base type quantizer step-size is given by the following formula:

$$\Delta_j^B = \min_{\text{image types } I} (\Delta_j^I).$$

Thus $\Delta_j^B \leq \Delta_j^I$ for all image types I. The base image type quantization scheme ensures that all coefficients are quantized finely enough to achieve the desired quality regardless of image type.

The classification unit 406 operates on the original image data, identifying an image type associated with each pixel. For example, in a document containing both text and photographic content, a spatial domain text-detection algorithm can be used to locate the text in the document. Many such algorithms are well-known in the art. One such technique involves computing and thresholding a gradient image, thereby identifying pixels corresponding to sharp edges, such as present in text characters. The output of this classification unit is the pixel type map 407, which is subsequently input to the subband coefficient type identifier 408.

Figure 5:
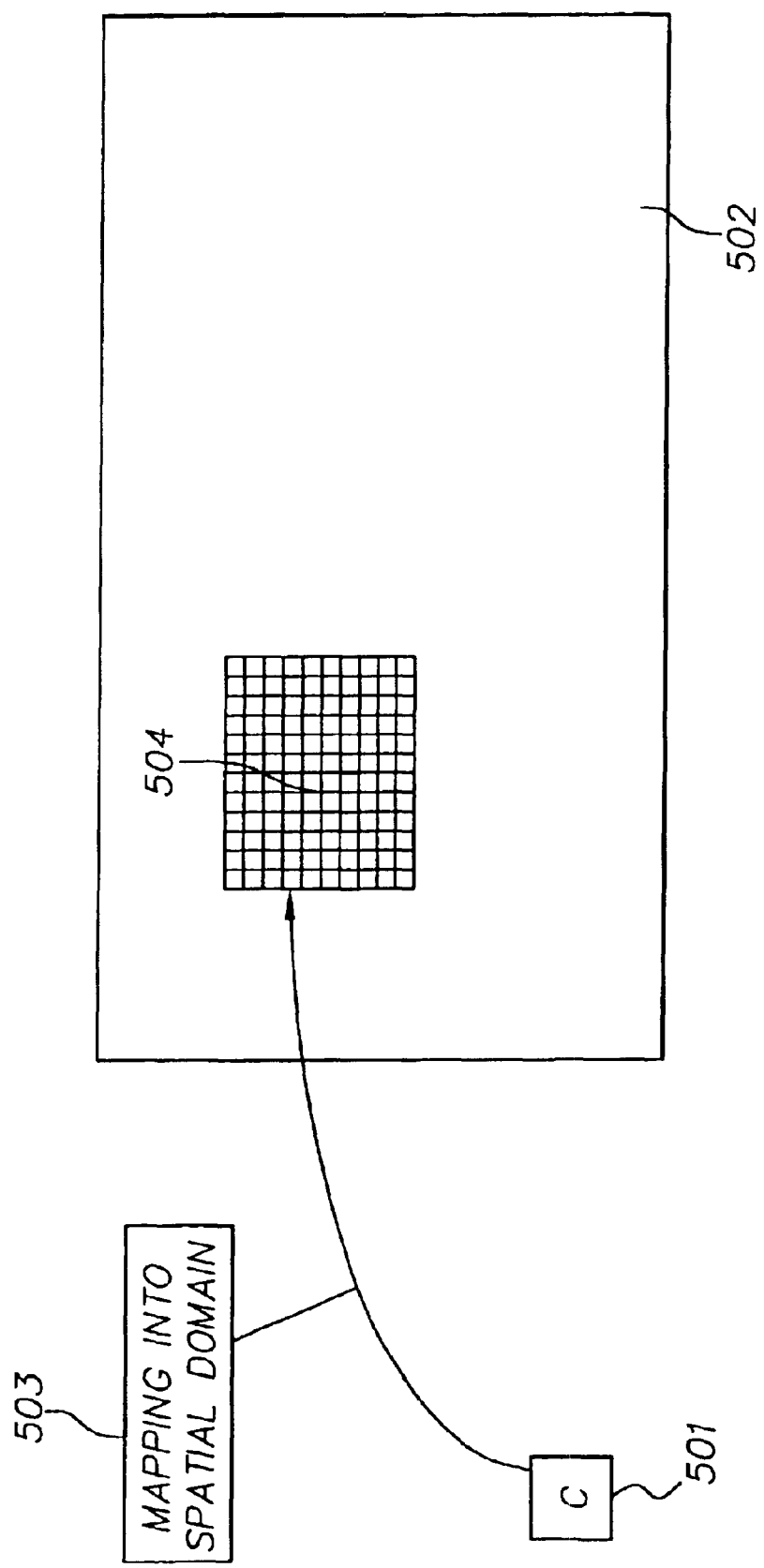
FIG. 5 is a diagram showing the mapping of a subband coefficient into the spatial domain.

In a particular embodiment, the subband coefficient type identifier operates on only the pixel type map to associate an image type with each coefficient. FIG. 5 illustrates how this decision is made. The spatial influence of a coefficient is mapped onto the pixel type map. For example, using the irreversible 9/7 filter pair as defined for JPEG2000, a coefficient in the HL1 subband has a spatial influence of 9×7. That is, the value of the coefficient affects the value of the output pixels in a 9×7 region. Among all the pixel types contained in the influence region, the type with the finest corresponding subband quantization step-size is chosen to represent that coefficient. For example, if the spatial influence of a coefficient contains pixels identified as text and pixels identified as background, the coefficient is classified as text, to assure that it is represented with the precision necessary to ensure that the text is high quality.

In an alternative embodiment, it is recognized that within the spatial influence region of a coefficient, some pixels are affected much more than others by the value of the coefficient. In this embodiment, only those pixels whose values are significantly affected by the coefficient, as identified by exceeding a threshold, $\tau$, on the coefficient contribution to the final pixel value, are considered when determining the image type associated with a coefficient.

It is also possible to consider the subband coefficient values themselves when determining the image type associated with a coefficient. In this alternative, the subband coefficient type identifier operates on the subband-domain data to associate an image type with each coefficient. Regardless of the specific algorithm used, the subband coefficient type identifier outputs the image type associated with each coefficient 409.

The image type bitplane discard table 410 is formed as in FIG. 6. In that figure, each table entry represents the number of bitplanes of data that can be discarded from coefficients of a particular image type and subband, assuming quantization according to the base image type quantizer step-sizes. In a particular embodiment, the number of discardable bitplanes is computed as $$\text{discard\_bitplanes}(j, I) = \left\lfloor \log_2 \frac{\Delta_j^I}{\Delta_j^B} \right\rfloor.$$

For example, if $\Delta_j^I = 4\Delta_j^B$, then $$\left\lfloor \log_2 \frac{\Delta_j^I}{\Delta_j^B} \right\rfloor = 2,$$

and 2 bitplanes of data can be discarded from a coefficient in subband j identified as having image type I. In the embedded quantization scheme of JPEG2000, the effective quantizer step-size of a coefficient is equal to $2^{M_j-N_j}\Delta_j^B$, where $M_j$ is the total number of significant bitplanes for subband j, and $N_j$ is the total number of significant bitplanes actually encoded. By dropping 2 bitplanes, $N_j = M_j - 2$, and thus the effective quantizer step-size is $4\Delta_j^B$, which equals $\Delta_j^I$ as desired.

For JPEG2000 compression with a reversible transform, $\Delta_j^B = 1$ for all j. The preceding formula can still be applied to determine the number of discardable bitplanes for each subband and image type.

Figure 7:
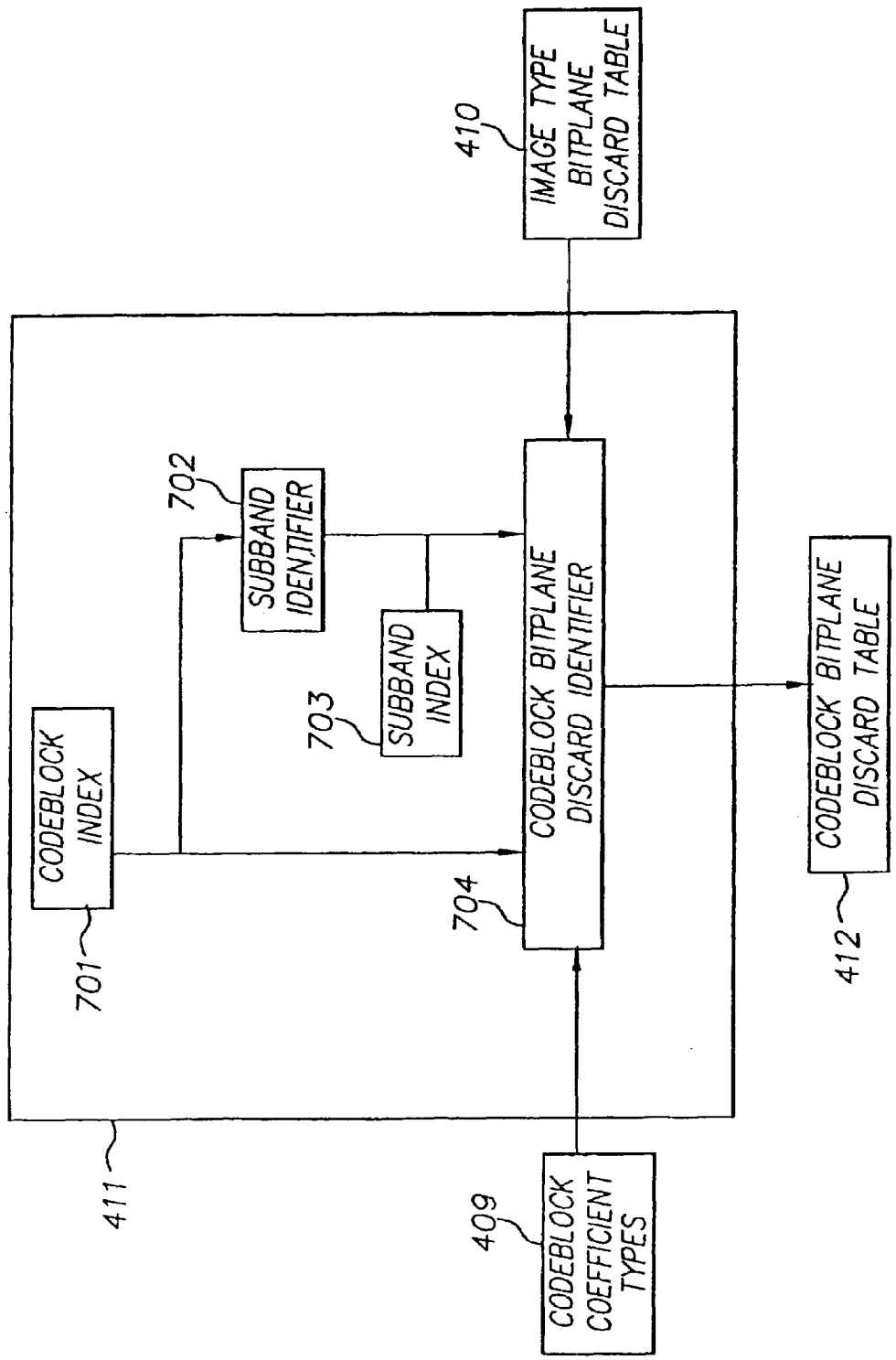
FIG. 7 is a flow chart of the codeblock bitplane discard unit of FIG. 4.

The codeblock bitplane discard unit 411 is shown in detail in FIG. 7. For each codeblock, the index of the codeblock 701 is sent to the subband identifier 702, which outputs the current subband 703. The subband index, the codeblock index, the subband coefficient types 409 and the image type bitplane discard table 410 are sent to the codeblock bitplane discard identifier 704, which outputs the number of bitplanes that can be discarded from the current codeblock. In a particular embodiment, the codeblock bitplane discard identifier computes the number of discardable bitplanes for each coefficient in the codeblock using the formula above, based on the quantization step-size associated with its image type and subband as well as the base image type quantization step-size associated with the subband. The discardable bitplanes for a codeblock is then chosen as the minimum number of discardable bitplanes from among the coefficients contained in the codeblock. These results are collected from all codeblocks to form the codeblock bitplane discard table 412.

The codeblock bitplane discard table 412, subband coefficient types 409, and subband coefficients 405 are sent to the subband coefficient modifier 413. The subband coefficient modifier operates to make each coefficient more compressible, while ensuring that at the decoder the reconstruction error will be within the tolerable error limit for that coefficient based on its image type. In a particular embodiment, given a coefficient c with desired quantization step-size $\Delta_j^I$, the subband coefficient modifier modifies the coefficient so as to make it more compressible while still ensuring that the reconstructed coefficient will have error less than $\Delta_j^I$ if the quantizer index associated with c is zero, and error no greater than $$\frac{\Delta_j^I}{2}$$

otherwise.

Shrinking the magnitude of coefficients generally makes them more compressible. There can be exceptions, based on unusual data or dependent upon other features, such as an inefficient coding unit. A small quantizer index is generally represented with fewer bits than a large quantizer index. Thus, bits are generally saved when the shrinking of the magnitude of a coefficient results in a quantizer index of smaller magnitude than would be derived from the original unmodified coefficient. The effect of shrinkage is particularly notable, when a coefficient can be quantized to zero.

Figure 8:
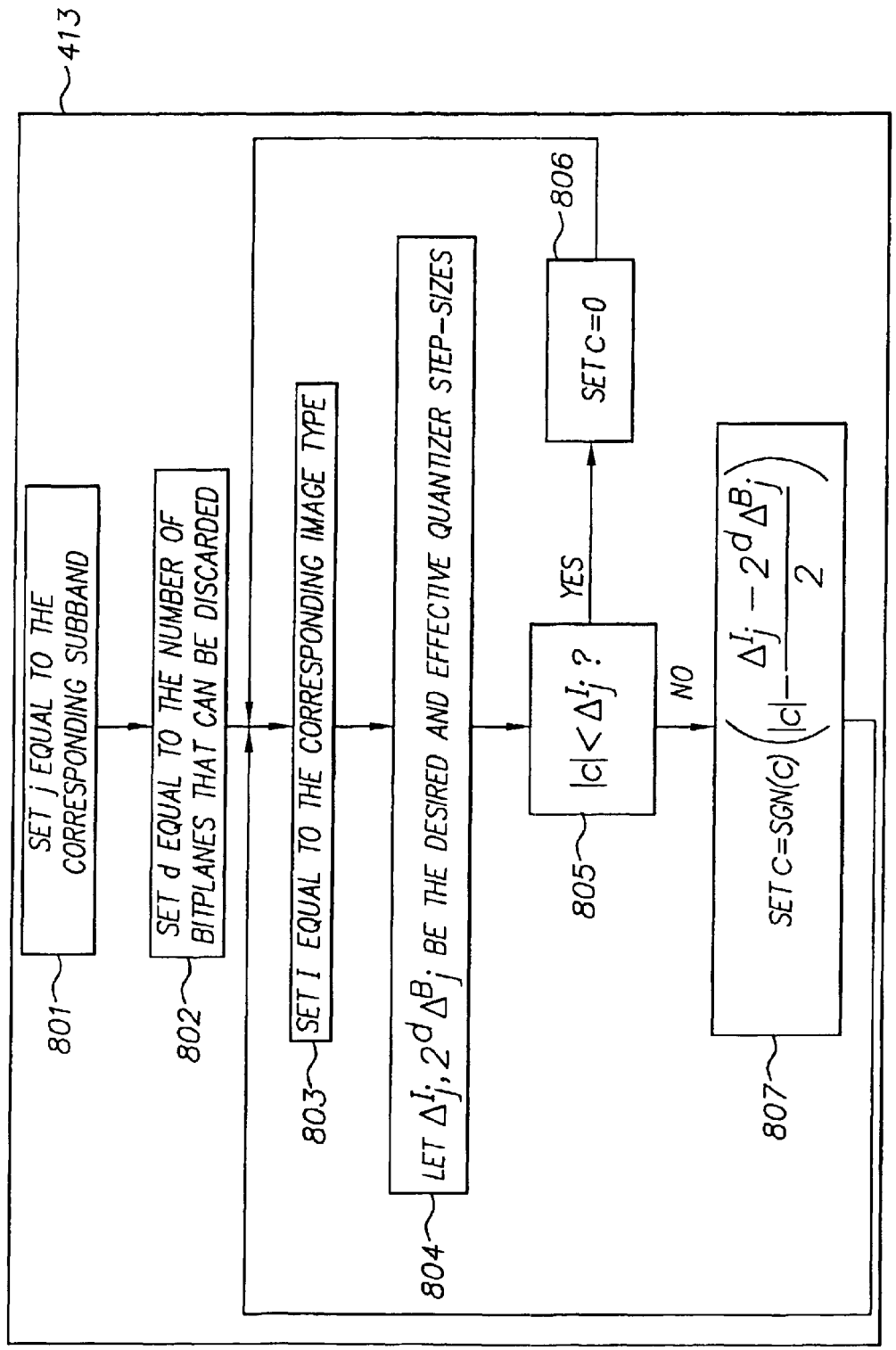
FIG. 8 is a flow chart of the subband coefficient modifier of FIG. 4.

A particular embodiment of the subband coefficient modifier is illustrated in FIG. 8. For a particular codeblock k, j is set (801) equal to the subband index associated with codeblock k. Also, the codeblock bitplane discard table 412 is accessed to identify (802) the number of bitplanes of data, d, that can be eventually discarded from the quantized coefficients in codeblock k. The value d is the largest integer that provides an effective quantization step-size $2^d \Delta_j^B$, which is no greater than the desired quantization step-size $\Delta_j^I$ for any coefficient image type I in that codeblock.

For each coefficient c, the associated image type, I, is obtained (803) from the subband coefficient types and the quantization step size is set (804). Thus, $\Delta_j^I$ is the desired quantization step-size for c, while $2^d \Delta_j^B$ is the eventual effective quantization step-size associated with c based on the base image type, B, and the number of discardable bitplanes, d. Note that $2^d \Delta_j^B \leq \Delta_j^I$.

Figure 9:
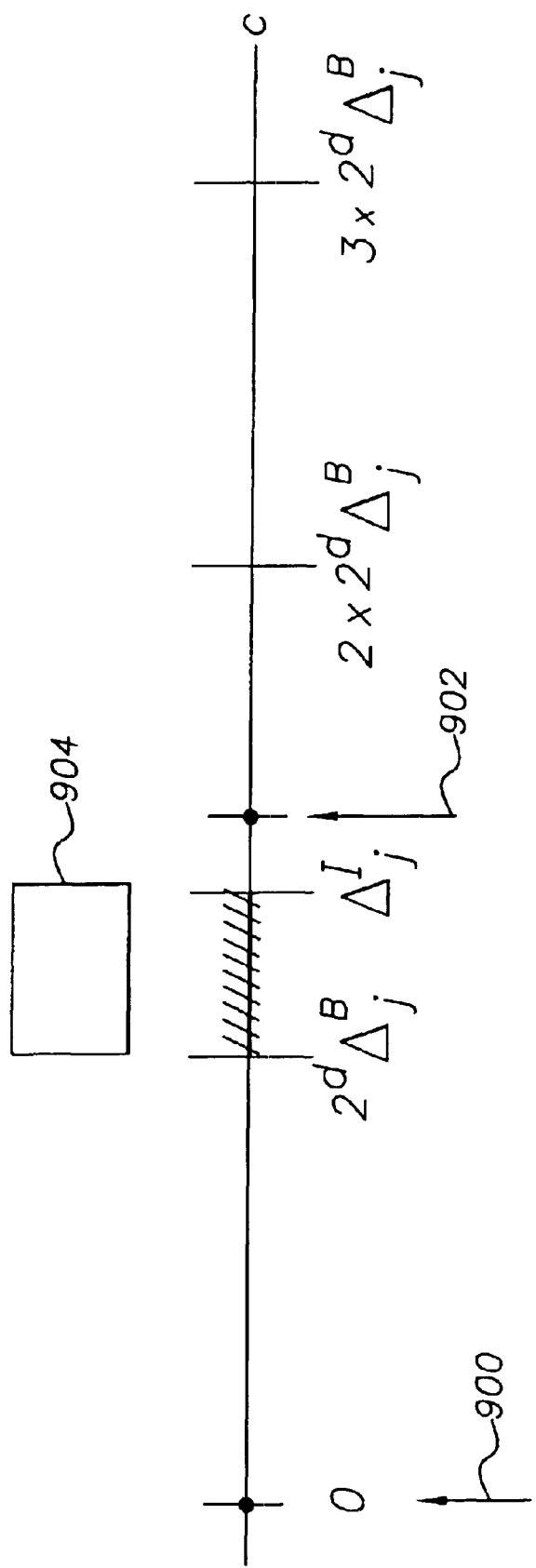
FIG. 9 is a graph of a coefficient interval modified so that the subsequent quantizer index is zero.

Next, a determination (805) is made as to whether c is less than $\Delta_j^I$. If the magnitude of c is less than $\Delta_j^I$, then based on its desired quantization step-size it is subsequently quantized to zero. Based on the effective quantizer step-size $2^d \Delta_j^B$, however, if $2^d \Delta_j^B \leq |c| < \Delta_j^I$, it will be effectively quantized to a non-zero value, resulting in wasted bits representing the coefficient at a higher fidelity than necessary. The subband coefficient modifier avoids these wasted bits by setting (806) all such coefficients to zero, ensuring that they will subsequently be quantized to zero as well. This concept is illustrated in FIG. 9. Arrow 900 indicates the reconstruction value if quantized to zero. Arrow 902 indicates the midpoint reconstruction point if quantized to 1. Normally quantized to 1, coefficients having image type I and a value in the interval indicated by bracket 904 can be modified so as to be quantized to zero and still have acceptable reconstruction error.

If $|c| \geq \Delta_j^I$, it is necessary to quantize c to a non-zero value, but it is desirable for maximum compression to choose the smallest magnitude quantizer index that ensures that the reconstruction error for c at the decoder will be less than $$\frac{\Delta_j^I}{2}.$$

Figure 10:
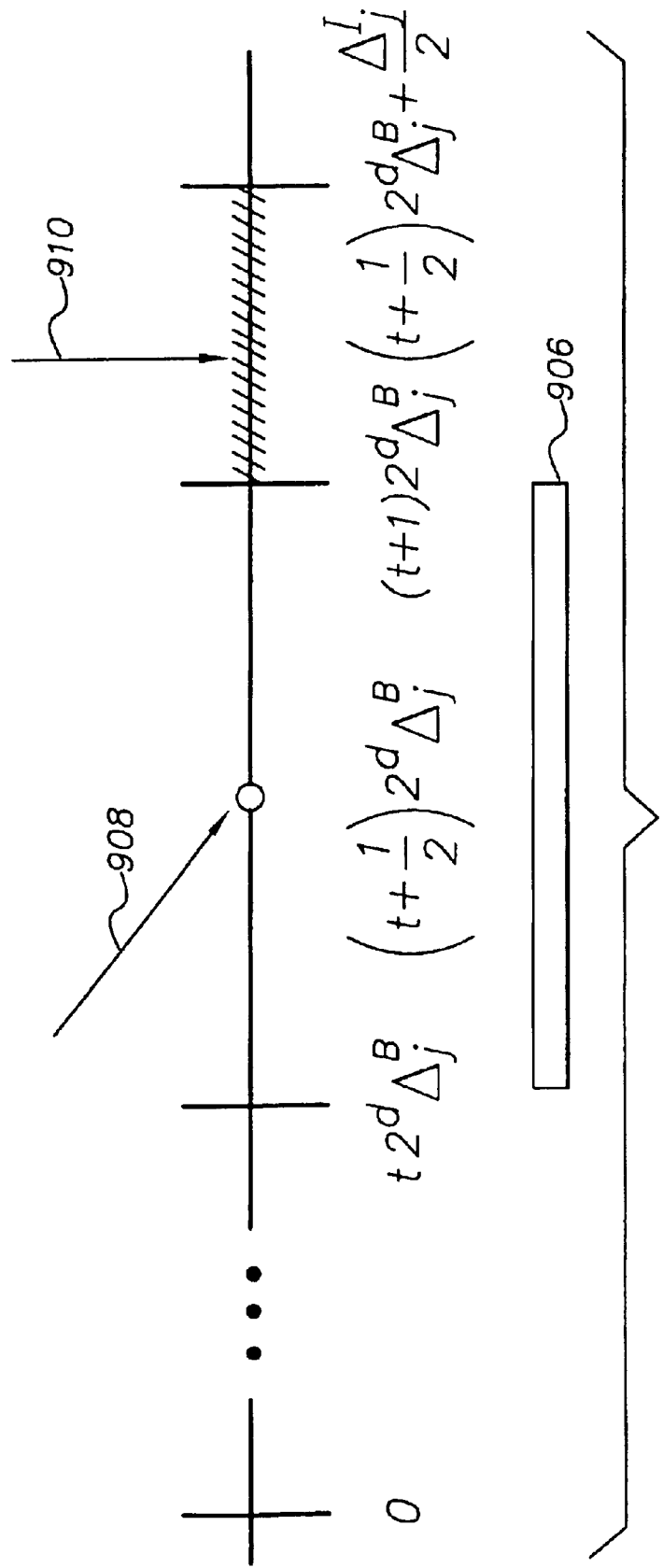
FIG. 10 is a graph of a coefficient interval modified so that the subsequent quantizer index is minimized.
Figure 11:
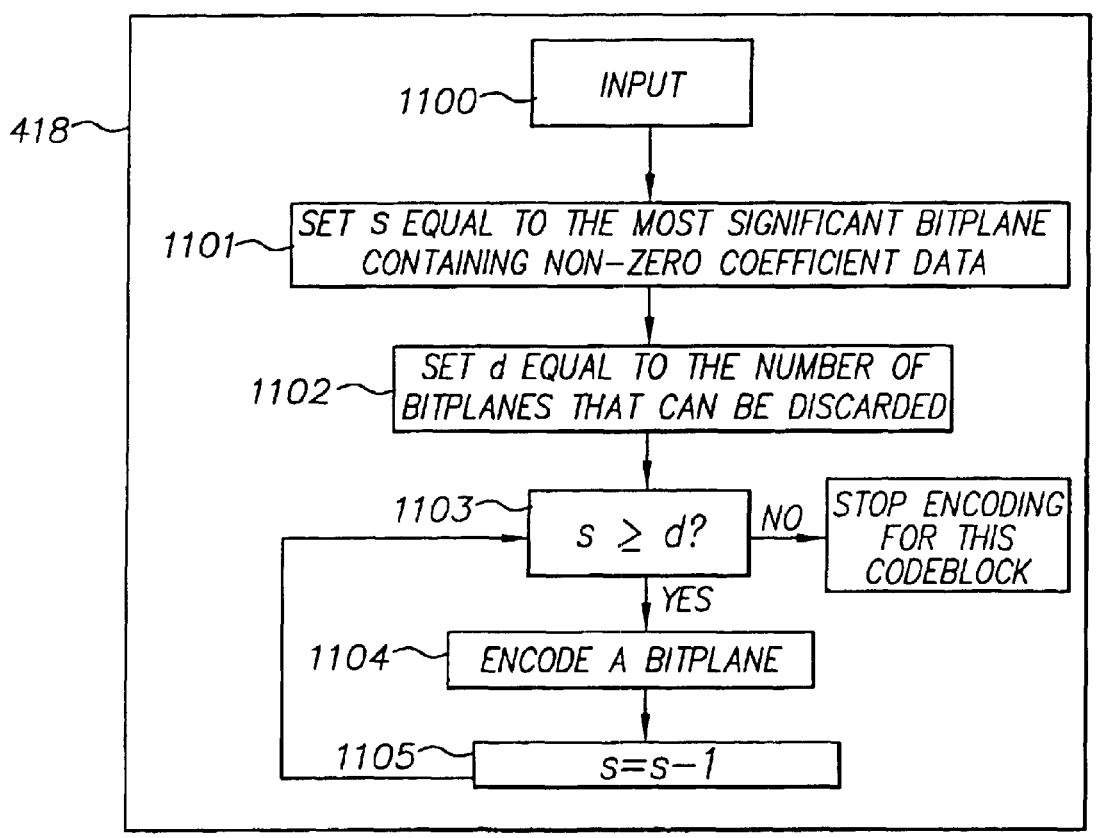
FIG. 11 is a diagrammatical view of the adaptive binary arithmetic coding unit of the image encoder of FIG. 4.

This concept is illustrated in FIG. 10. Bracket 906 indicates coefficients in an interval having the quantizer index t. Arrow 908 indicates the reconstruction point for coefficients with the quantizer index t. Arrow 910 indicates a range of coefficients that can safely be represented with index t and still ensure reconstruction error of less than $$\frac{\Delta_j^I}{2}$$

After quantization by a base step-size of $\Delta_j^B$ and discarding d bitplanes such that the effective quantization step-size is $2^d \Delta_j^B$, all coefficients in the interval $[t2^d \Delta_j^B, (t+1)2^d \Delta_j^B)$ have quantizer index t and are reconstructed at the decoder to the value $$\left(t + \frac{1}{2}\right) 2^d \Delta_j^I,$$

ensuring a reconstruction error no greater than $2^{d-1} \Delta_j^B$. Coefficients with value greater than or equal to $(t+1)2^d \Delta_j^B$ are effectively quantized to an index of t+1 or greater.

Given the desired quantization step-size $\Delta_j^I$ for coefficient c, however, there exists an additional interval of values from $$\left[(t+1)2^d \Delta_j^B, \left(t + \frac{1}{2}\right) 2^d \Delta_j^B + \frac{\Delta_j^I}{2}\right)$$

that can be assigned a quantizer index of t and still ensure that the reconstruction error is less than $$\frac{\Delta_j^I}{2}.$$

This corresponds to a smaller quantizer index than would be assigned to coefficients in this interval by the encoder of FIG. 1, and correspondingly results in a decreased overall bit rate required to encode the coefficient. This effect exists for all quantization intervals outside of the deadzone, and can be achieved by decreasing the magnitude of coefficients, that is, shrinking (807) the coefficients, prior to quantizing them, based on the following formula:

$$c' = sgn(c)\left(|c| - \left(\frac{\Delta_j^I - 2^d \Delta_j^B}{2}\right)\right) \text{ if } |c| \geq \Delta_j^I.$$

The output of the subband coefficient modifier 413 is the modified subband coefficients 414, which are subsequently input to the uniform quantizer with deadzone 416 and quantized according to the base image type quantization step-sizes 415.

The quantized subband coefficients 417 are input to the adaptive binary arithmetic coding unit 418. The adaptive binary arithmetic coding unit is shown in greater detail in FIG. 11. A codeblock is input (1100) and s is set (1101) equal to the most significant bitplane containing non-zero coefficient data (the LSB is considered bitplane 0). Also d is set (1102) equal to the number of bitplanes of data that can be discarded for the current codeblock, based on the codeblock bitplane discard table. A determination (1103) is made as to whether $s \geq d$. If $s \geq d$, then one bitplane is encoded (1104) and s is decremented (1105).

The compressed coding pass data 419 is finally aggregated by the bitstream organizer 420 to form the final compressed bitstream 421.

Figure 12:
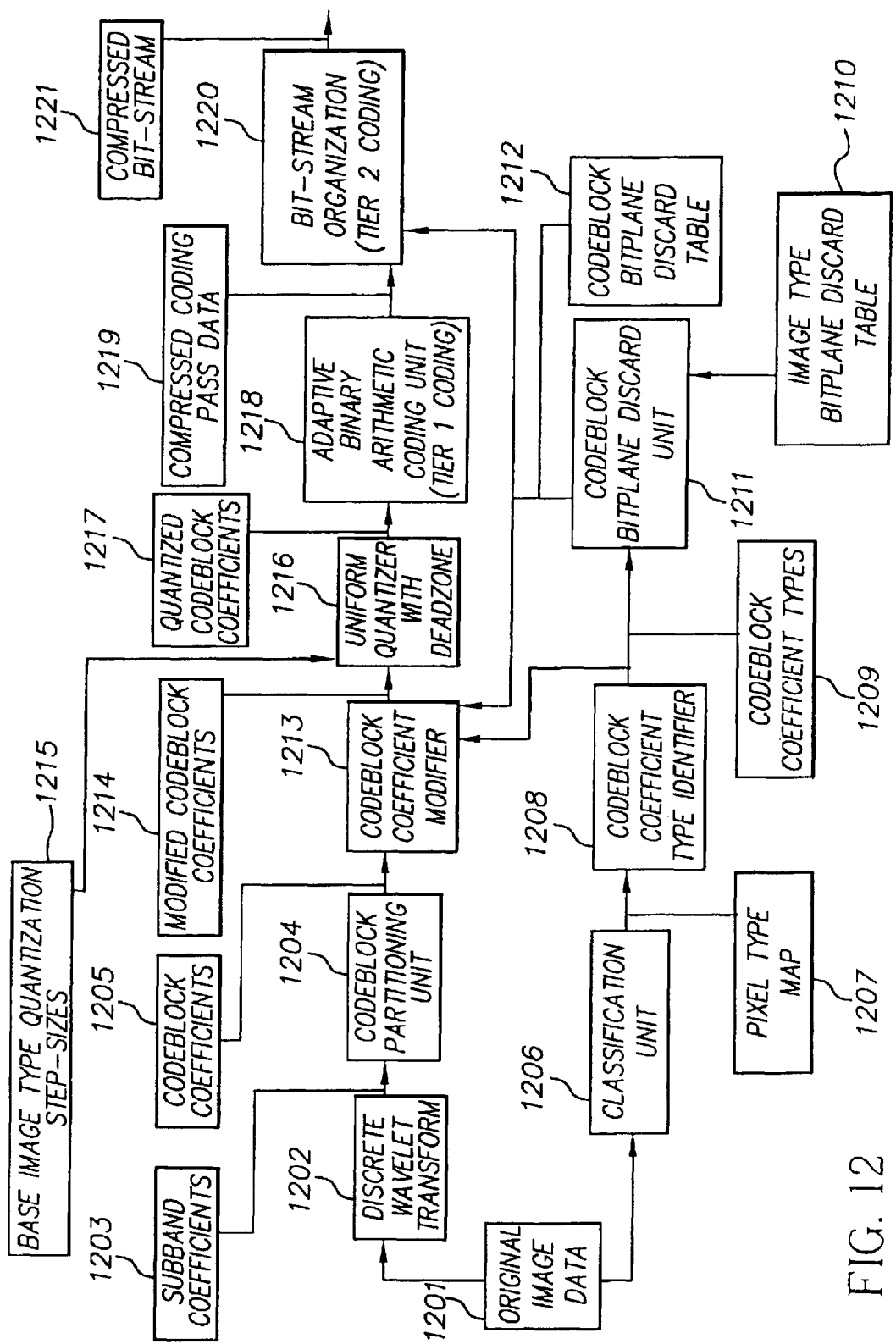
FIG. 12 is a flow chart of another embodiment of the image encoder.

In an alternative embodiment, all bitplanes of data are encoded by the adaptive binary arithmetic coding unit 418. Discarding of data is not achieved by the adaptive binary arithmetic coding unit. Instead, it is achieved by discarding the equivalent compressed coding pass data during the formation of the final compressed bitstream. This embodiment is illustrated in FIG. 12. While this embodiment is more computationally complex than a particular embodiment (it performs arithmetic coding for some bitplanes which are subsequently discarded by the bitstream organizer), it has the advantage that the arithmetic coding unit operates independently of any codeblock classification information.

Adaptive Quantization Limited to Discarding of Bitplanes

In alternative embodiments, adaptive quantization is achieved at the codeblock level by discarding bitplanes. In this case, shrinkage and/or other modification of subband coefficients is either an alternative procedure or an optional step. An example of a non-shrinkage modification is thresholding coefficients to, in effect, change the size of the deadzone. Given an initial quantization step-size for a subband, the effective quantization step-size associated with a codeblock in a subband can be controlled based on the number of coding passes from that codeblock that are included in the compressed bitstream. Given a text-based subband quantization step-size, codeblocks within that subband corresponding to photographic and background regions can achieve additional compression corresponding to a higher effective quantization step-size by dropping some of the bitplanes of information.

This embodiment of adaptive quantization only at the codeblock level, has limitations. Given a codeblock quantized according to a particular step-size, $\Delta_j$, the only achievable effective quantization step-sizes are powers of two of this term, i.e. $2^k \Delta_j$, obtained by dropping k bitplanes of data. If the desired quantization step-size $\Delta_i$ is not exactly of the form $\Delta_i = 2^k \Delta_j$, it is necessary to quantize less aggressively than desired. For example, if $2^k \Delta_j < \Delta_i < 2^{k+1} \Delta_j$, only k bitplanes of data can safely be discarded, resulting in an effective quantization step-size of $2^k \Delta_j$.

A second limitation of adaptive quantization at the codeblock level is that the granularity of the classification can still be too coarse, similar to the case of adaptive quantization at the tile level. A typical JPEG2000 codeblock contains a 64×64 block of wavelet coefficients. Such a codeblock from the first wavelet decomposition level corresponds to roughly a 128×128 region of the image. A codeblock from the second decomposition level corresponds to roughly a 256×256 region. From the third decomposition level, the corresponding region is approximately 512×512. As the spatial support of the codeblock increases, it becomes more likely that this support contains some regions of text or line art and the codeblock must therefore by classified as text in its entirety.

If these limitations are problematic in a particular application, then the coefficient shrinkage procedures earlier described can be utilized, alone or in combination with discarding of bitplanes.

Figure 13:
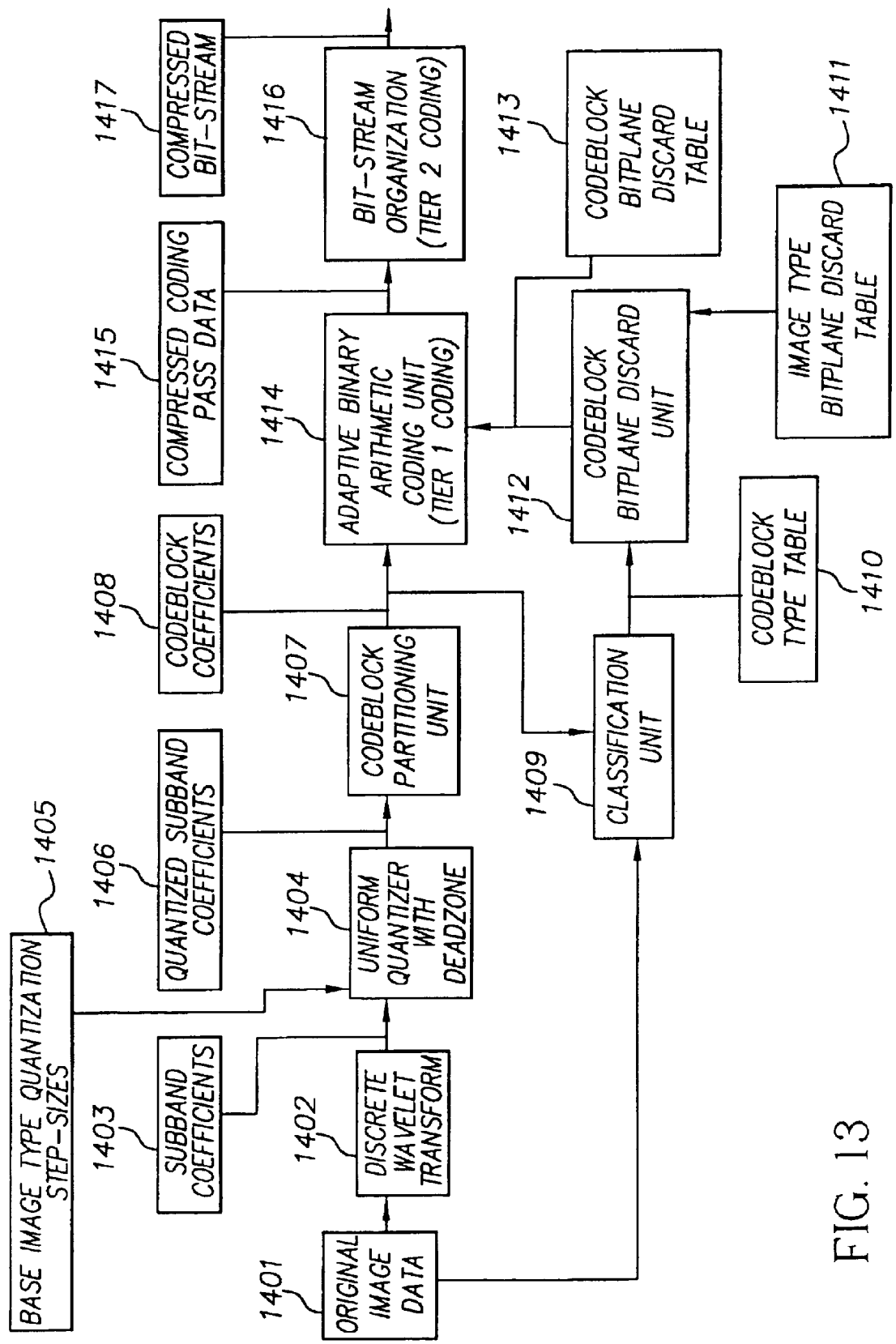
FIG. 13 is a diagrammatical view of another embodiment of the image encoder.

FIGS. 13–16 illustrate an embodiment of an encoder providing adaptive quantization only at the codeblock level by discarding bitplanes. Referring to FIG. 13, a digital image 1401 undergoes a discrete wavelet transform (DWT) in a DWT unit 1402 to produce an image representation in terms of subband coefficients 1403. (It will be understood that features having the same names as those earlier described have like characteristics, except as specifically indicated, notwithstanding differences in reference numbers between the different embodiments. For example, the earlier discussion of image components and tiles is applicable here.)

The subband coefficients 1403 are quantized with a uniform quantizer with deadzone 1404 according to a set of quantizer step-sizes appropriate for a base image type 1405. The quantized subband coefficients 1406 are partitioned into codeblocks 1408 by a codeblock partitioning unit 1407. The order of quantizing and partitioning can be reversed, if desired.

The subband coefficients 1408 along with the original image data are processed by a classification unit 1409, which determines an image type associated with each codeblock. In a particular embodiment, the classification unit operates on the original image data, identifying an image type associated with each pixel or region of pixels, and then uses knowledge of which pixels contribute to each codeblock to associate an image type with each codeblock. Procedures here are like those earlier described in relation to the determination of pixels that contribute to a subband coefficient.

For example, in a document containing both text and photographic content, a spatial domain text-detection algorithm can be used to locate the text in the document. Many such algorithms are well-known in the art. One such technique involves computing and thresholding a gradient image, thereby identifying pixels corresponding to sharp edges, such as present in text characters. Given a pixel-based classification as text/non-text, a codeblock can be classified as a text image type codeblock if its spatial support region includes any pixels labeled as text.

In an alternative, the classification unit can operates on subband-domain codeblock data to associate an image type with each codeblock. For example, the procedures earlier described can be used to associate image types and subband coefficients within a particular codeblock. A determination can then be made to classify the codeblock with a particular image type based upon the median image type, or the image type requiring the least compression, or some other standard.

Regardless of the specific classification algorithm used, the classification unit produces a codeblock type table 1410 which indicates an image type associated with each codeblock. The codeblock type table along with an image type bitplane discard table 1411, are input to a codeblock bitplane discard unit 1412. The image type bitplane discard table indicates how many bitplanes of data can be discarded from coefficients belonging to a codeblock of a particular image type and subband. The codeblock bitplane discard unit computes a table indicating how many bitplanes of data can be discarded from each codeblock 1413.

The subband coefficients, along with the codeblock bitplane discard table, are input to the adaptive binary arithmetic coder unit 1414. An adaptive binary arithmetic coder encodes the coefficients for each codeblock, discarding appropriate bitplanes according to the codeblock bitplane discard table, and producing compressed coding pass data 1415. The compressed coding pass data is aggregated by a bit-stream organization unit 1416 into the final compressed bit-stream 1417.

FIG. 13 will now be described in greater detail. For a single component image, the discrete wavelet transform produces subband coefficients for m subbands, where m=3k+1, and k is the number of decomposition levels in the wavelet transform. The subband coefficients are then quantized according to the base type step sizes. Any image type I has associated quantization step-sizes $\Delta^I_j$ for j=1,2,3, . . . , m that indicate the desired quantization level for coefficients from each subband identified as having that image type. Each quantizer step-size set has a base type step size $\Delta_j^B$ associated with subband j.

For each subband j, the base type quantizer step-size $\Delta_j^B$ is chosen to correspond to the finest quantization, and correspondingly the most precise representation, required across all image types to represent the coefficients of subband j at the desired fidelity. Similarly, for image type I and subband j, the quantizer step-size $\Delta^I_j$ corresponds to the allowable quantization for a coefficients of image type I from subband j. In a particular embodiment, for each subband, j, the base type quantizer step-size is given by the following formula:

$$\Delta_j^B = \min_{image\ types\ I} (\Delta^I_j).$$

Thus $\Delta_j^B \leq \Delta^I_j$ for all image types I.

The image type bitplane discard table 1411 is formed as in FIG. 6. In that figure, each table entry represents the number of bitplanes of data that can be discarded from coefficients of a particular image type and subband. In this embodiment, the number of discardable bitplanes is computed as $$\text{discard\_bitplanes}(j, I) = \left\lfloor \log_2 \frac{\Delta_j^I}{\Delta_j^B} \right\rfloor.$$

For example, if $\Delta_j^I = 4\Delta_j^B$, then $$\left\lfloor \log_2 \frac{\Delta_j^I}{\Delta_j^B} \right\rfloor = 2,$$

and 2 bitplanes of data can be discarded. In the embedded quantization scheme of JPEG2000, the effective quantizer step-size of a coefficient is equal to $2^{M_j-N_j}\Delta_j^B$, where $M_j$ is the total number of significant bitplanes for subband j, and $N_j$ is the total number of significant bitplanes actually encoded. By dropping 2 bitplanes, $N_j = M_j - 2$, and thus the effective quantizer step-size is $4\Delta_j^B$, which equals $\Delta_j^I$ as desired.

For JPEG2000 compression with a reversible transform, $\Delta_j^B = 1$ for all j. The preceding formula can still be applied to determine the number of discardable bitplanes for each subband and image type.

Figure 14:
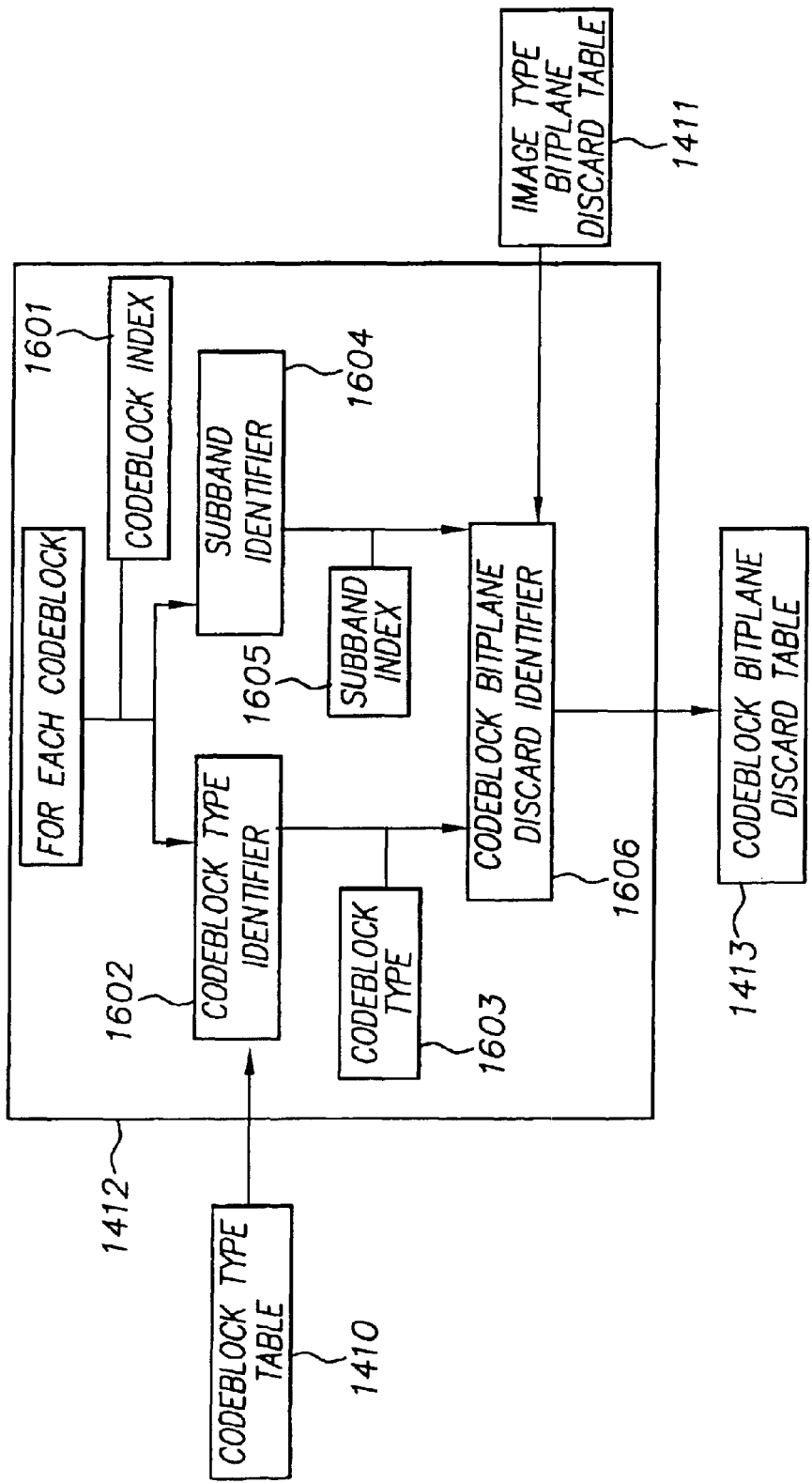
FIG. 14 is a flow chart of the codeblock bitplane discard unit of FIG. 13.

The codeblock bitplane discard unit 1412 is shown in greater detail in FIG. 14. For each codeblock, the index of the codeblock 1601, along with the codeblock type table 1410, is sent to the codeblock type identifier 1602, which outputs the current codeblock type 1603. The codeblock index is also input to the subband identifier 1604, which outputs the current subband 1605. The current codeblock type and the current subband are input along with the image type bitplane discard table 1411 to the codeblock bitplane discard identifier 1606, which outputs the number of bitplanes that can be discarded from the current codeblock. These results are collected from all codeblocks to form the codeblock bitplane discard table 1413.

Figure 15:
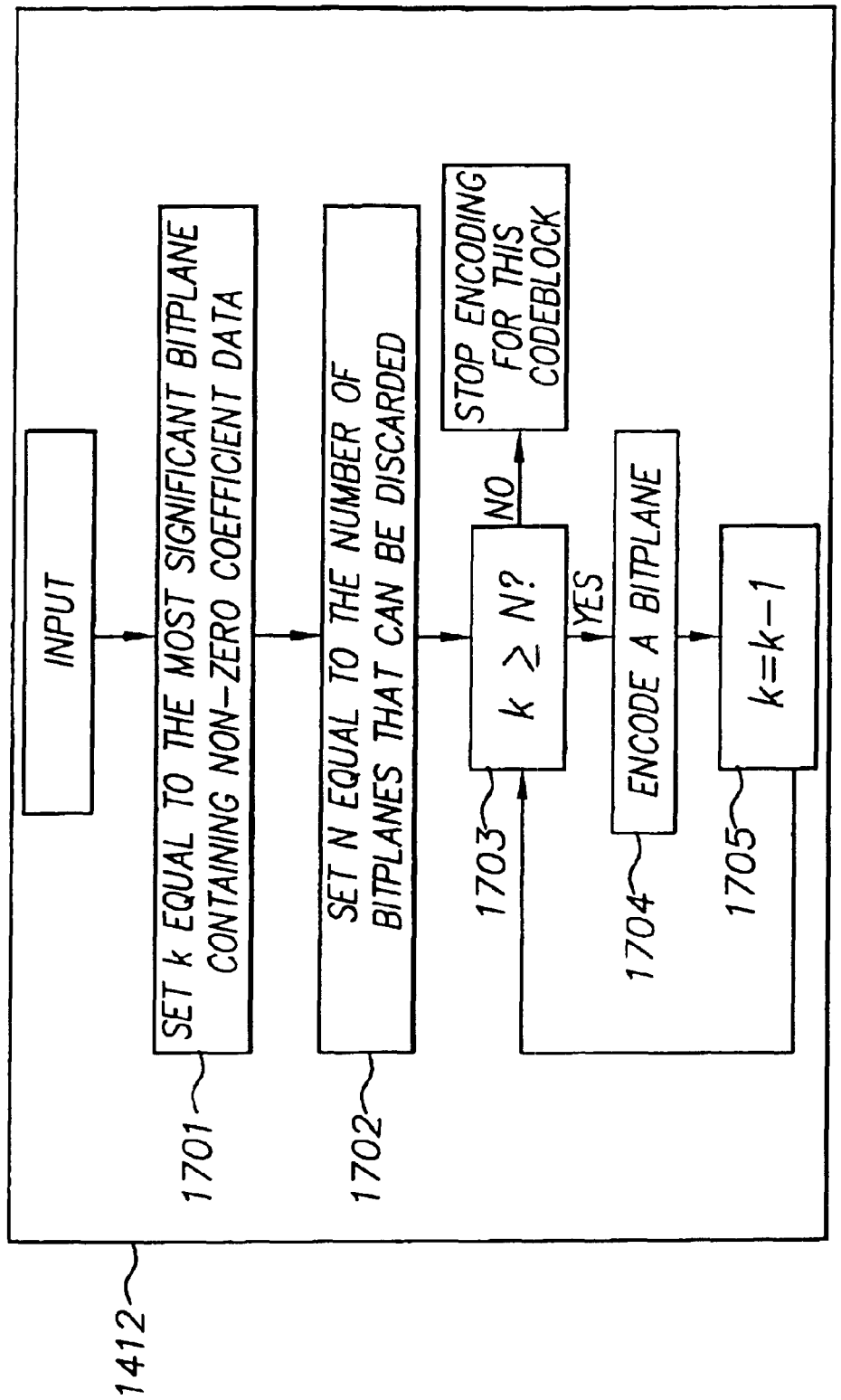
FIG. 15 is a diagrammatical view of the adaptive binary arithmetic coding unit of FIG. 13.

The adaptive binary arithmetic coding unit is described in greater detail in FIG. 15. For each codeblock, k is set equal to the most significant bitplane containing non-zero coefficient data (the LSB is considered bitplane 0) 1701. N is set equal to the number of bitplanes of data that can be discarded for the current codeblock 1702, based on the codeblock bitplane discard table. While $k \geq N$ 1703, one bitplane is encoded 1704 and k is decremented 1705.

Figure 16:
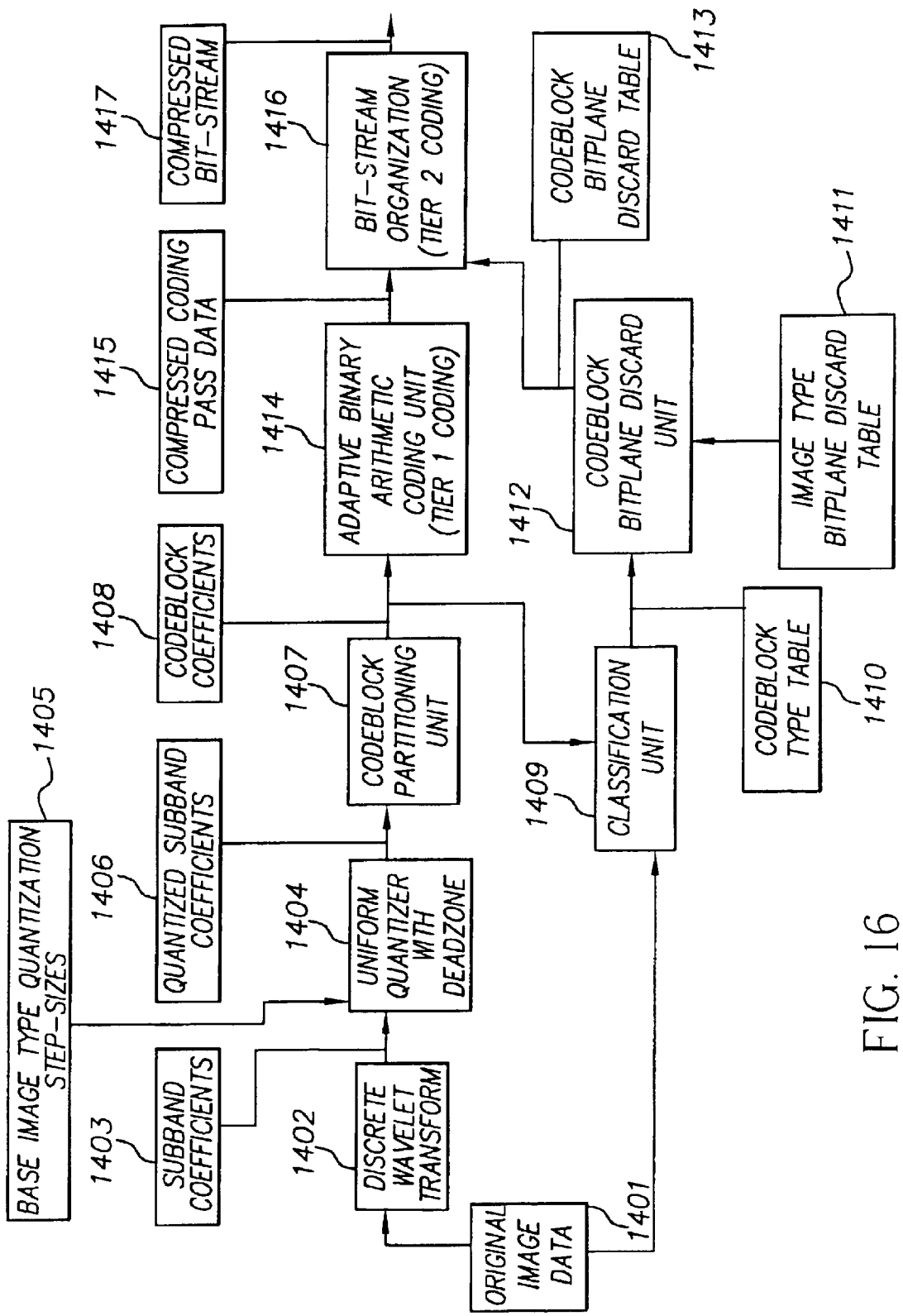
FIG. 16 is a diagrammatical view of yet another embodiment of the image encoder.

In an alternative embodiment shown in FIG. 16, all bitplanes of data are encoded by the adaptive binary arithmetic coding unit. Discarding of data is not achieved by the adaptive binary arithmetic coding unit. Instead, it is achieved by discarding the equivalent compressed coding pass data during the formation of the final compressed bitstream. While this embodiment is more computationally complex than the previous embodiment (it performs arithmetic coding for some bitplanes which are subsequently discarded), it has the advantage that the arithmetic coding unit operates independently of any codeblock classification information.

The invention has been described in detail with particular reference to certain preferred embodiments thereof, but it will be understood that variations and modifications can be effected within the spirit and scope of the invention.

What is claimed is:

1. A method for encoding digital image data representing a plurality of initial pixels, each said initial pixel having a coordinate, said method having a plurality of predefined image types, each said image type having a preassigned one of a plurality of quantization step-size sets, said method comprising the steps of:

associating a respective one of a plurality of different image types and a respective said quantization step-size set with each of the coordinates;

transforming the digital image data using a subband decomposition to produce a plurality of subbands, each said subband having a plurality of subband coefficients, said subband coefficients defining a plurality of resultant pixels and ones of said resultant pixels contributed to by respective said subband coefficients, said resultant pixels each having a respective one of said coordinates;

shrinking each of said subband coefficients by an adjustment that is a function of respective said quantization step-size sets of said coordinates of respective said ones of said resultant pixels to provide corresponding adjusted coefficients.

2. The method of claim 1 wherein said transforming defines a mapping of said coordinates of said resultant pixels into a plurality of influence regions; and said method further comprises selecting an image type, in each said influence region, having the corresponding said quantization step-size set of smallest magnitude.

3. The method of claim 1 further comprising quantizing each said adjusted coefficient to provide a respective quantized coefficient.

4. The method of claim 3 wherein said quantizing and said adjustment together provide an effective quantization step-size set for each said subband coefficient that is larger than or equal to the smallest of said quantization step-size sets of the digital image data.

5. The method of claim 3 further comprising the steps of:

following said transforming, partitioning each said subband into a plurality of codeblocks;

forming a plurality of partial-bitplanes from respective said quantized coefficients of each said codeblock of each said subband;

following said quantizing, entropy encoding each said codeblock of quantized coefficients independently of the other said codeblocks to provide encodement values; and discarding at least one of said partial-bitplanes;

wherein said shrinking, said quantizing, and said discarding steps together provide an effective quantization step-size set for each said subband coefficient that is larger than or equal to the smallest of said quantization step-size sets of the digital image data.

6. The method of claim 5 further comprising, prior to said entropy encoding:

forming a plurality of partial-bitplanes from said quantized coefficients of each said codeblock of each said subband; and discarding any of said partial-bitplanes having a discard parameter in a predetermined range, said discard parameter being a function of a respective said assigned step-size set.

7. The method of claim 3 further comprising the steps of:

following said transforming, partitioning each said subband into a plurality of codeblocks;

following said shrinking, entropy encoding each said codeblock independently of the other said codeblocks to provide encodement values; and combining said encodement values into a continuous bitstream.

8. The method of claim 7 further comprising, prior to said entropy coding:

forming at least one partial-bitplane from said quantized coefficients of each said codeblock of each said subband; and discarding any of said partial-bitplanes having a discard parameter in a predetermined range, said discard parameter being a function of a respective said assigned step-size set.

9. The method of claim 8 wherein said discard parameter is a function of both said respective assigned step-size set and a predetermined quantization step-size set.

10. The method of claim 3 wherein said quantizing of each said adjusted coefficient utilizes a predetermined base quantization step-size set to provide said respective encodement values.

11. The method of claim 10 wherein said predetermined base quantization step-size set has the smallest magnitude of said plurality of quantization step-size sets.

12. The method of claim 10 wherein said transforming defines a mapping of said coordinates of said resultant pixels into a plurality of influence regions; and said method further comprises selecting an image type, in each said influence region, having the corresponding said quantization step-size set of smallest magnitude.

13. The method of claim 1 wherein said transforming further comprises applying a discrete wavelet transform.

14. A computer program product for encoding digital image data representing a plurality of pixels, said product comprising: a computer readable storage medium having a computer program stored thereon, said computer program defining a coordinate of each said pixel, said computer program defining a plurality of image types, each said image type having a preassigned one of a plurality of quantization step-size sets, said computer program performing the steps of:

associating a respective one of a plurality of different image types and a respective said quantization step-size set with each of the coordinates;

transforming the digital image data using a subband decomposition to produce a plurality of subbands, each said subband having a plurality of subband coefficients, said subband coefficients defining a plurality of resultant pixels and ones of said resultant pixels contributed to by respective said subband coefficients, said resultant pixels each having a respective one of said coordinates;

shrinking each of said subband coefficients by an adjustment that is a function of respective said quantization step-size sets of said coordinates of respective said ones of said resultant pixels to provide corresponding adjusted coefficients.

15. An image encoder for encoding digital image data representing a plurality of pixels, said encoder comprising:

a classification unit, which determines the image type associated with each pixel and outputs a first map defining coordinates and image type of each said pixel, each said image type having a preassigned one of a plurality of quantization step-size sets;

a transform unit applying a subband decomposition to said digital image data, said transform unit outputting a plurality of subbands, each said subband having a plurality of subband coefficients, said subband coefficients defining a second map of resultant pixels having the same coordinates as said first map, said second map defining ones of said resultant pixels contributed to by respective said subband coefficients;

a coefficient type identifier receiving said maps, said coefficient type identifier determining corresponding ones of said subband coefficients and said quantization step-size sets at each of said coordinates; and responsively outputting coefficient types, each said coefficient type defining an adjustment that is a function of one or more of respective said quantization step-size sets corresponding to respective said subband coefficients;

a subband coefficient modifier receiving said coefficient types and responsively shrinking each said coefficient by a respective said adjustment.

16. The image encoder of claim 15 wherein said second map maps said coordinates of said resultant pixels into a plurality of influence regions; and said classification unit selects an image type, in each said influence region, having the corresponding said quantization step-size set of smallest magnitude.

17. The image encoder of claim 15 further comprising a uniform quantizer having a deadzone, said quantizer quantizing said adjusted coefficients.

18. The image encoder of claim 17 wherein said shrinking and said quantizing together provide an effective quantization step-size set for each said subband coefficient that is larger than or equal to the smallest of said quantization step-size sets of the digital image data.

19. The image encoder of claim 17 further comprising:

an image type bitplane discard table having predetermined number of partial-bitplane discards associated with possible combinations of said image types and said subbands;

a codeblock bitplane discard unit receiving said adjusted coefficients and respective said partial-bitplane discards and responsively generating an identification of ones of said partial-bitplanes discardable from each said codeblock;

an arithmetic binary coding unit receiving said adjusted coefficients and said identification of said discardable partial-bitplanes, said coding unit encoding said adjusted coefficients for each said codeblock and discarding the respective said discardable partial-bitplanes.

20. The image encoder of claim 19 wherein said shrinking, said quantizing, and said discarding together provide an effective quantization step-size set for each said subband coefficient that is larger than or equal to the smallest of said quantization step-size sets of the digital image data.

* * * * *